United States Patent [19]
Berrier et al.

[11] Patent Number: 5,407,784
[45] Date of Patent: Apr. 18, 1995

[54] PHOTOCURABLE COMPOSITION COMPRISING MALEIC ANHYDRIDE ADDUCT OF POLYBUTADIENE OR BUTADIENE COPOLYMERS

[75] Inventors: Arthur L. Berrier, Ellicott City, Md.; Ronald J. Kumpfmiller, Waltham, Mass.

[73] Assignee: W. R. Grace & Co.-Conn., New York, N.Y.

[21] Appl. No.: 671,937

[22] Filed: Mar. 22, 1991

Related U.S. Application Data

[63] Continuation-in-part of Ser. No. 514,899, Apr. 26, 1990, abandoned.

[51] Int. Cl.$^6$ .................................................. G03C 1/725
[52] U.S. Cl. ..................... 430/287; 430/270; 430/288; 522/121; 522/179; 525/193; 525/285; 526/271; 526/272
[58] Field of Search ............... 430/270, 285, 287, 288; 526/271, 272; 525/193; 522/121, 179

[56] References Cited

U.S. PATENT DOCUMENTS

| | | | |
|---|---|---|---|
| 2,760,863 | 8/1952 | Plambeck, Jr. | 95/5.6 |
| 3,546,184 | 12/1970 | Heidel et al. | 260/78.4 |
| 3,766,215 | 10/1973 | Hesse et al. | 260/346.8 |
| 3,974,129 | 8/1976 | De La Mare | 204/159.24 |
| 4,023,973 | 5/1977 | Imaizumi et al. | 96/115 R |
| 4,038,084 | 7/1977 | Nakano et al. | 96/115 P |
| 4,045,231 | 8/1977 | Toda et al. | 96/115 P |
| 4,162,240 | 7/1979 | Hino et al. | 260/29.7 B |
| 4,192,684 | 3/1980 | Gensho et al. | 430/284 |
| 4,442,302 | 4/1984 | Pohl | 204/159.23 |
| 4,722,947 | 2/1988 | Thanawalla et al. | 522/120 |
| 4,762,892 | 8/1988 | Koch et al. | 525/279 |
| 4,857,434 | 8/1989 | Klinger | 430/286 |
| 4,916,045 | 4/1990 | Koch et al. | 430/270 |

FOREIGN PATENT DOCUMENTS

| | | |
|---|---|---|
| 50-73944 | 8/1975 | Japan . |
| 51-37128 | 4/1976 | Japan . |
| 52-81396 | 10/1977 | Japan . |
| 54-129044 | 12/1979 | Japan . |
| 57-23693 | 4/1987 | Japan . |
| 1598894 | 3/1978 | United Kingdom . |

OTHER PUBLICATIONS

Translation of Takiyama, Kokai #52-81396 Dated 7 Jul. 1977.

*Primary Examiner*—Mark A. Chapman
*Attorney, Agent, or Firm*—Bharat C. Gandhi

[57] ABSTRACT

An aqueous-developable article is made from a photoprepolymer made by reacting a maleated polyalkadienyl homo- or copolymer (e.g., polybutadiene) with an olefinically unsaturated compound capable of opening anhydride rings (e.g., hydroxyethyl methacrylate) with simultaneous chain extension using a polyalkadienyl polyol, followed by hydrolysis and neutralization with Li—, Na—, or K-containing base. When formulated with unsaturated monomers and photoinitiators, the photoprepolymer is particularly useful in making photopolymer-based flexographic printing plates.

10 Claims, 1 Drawing Sheet

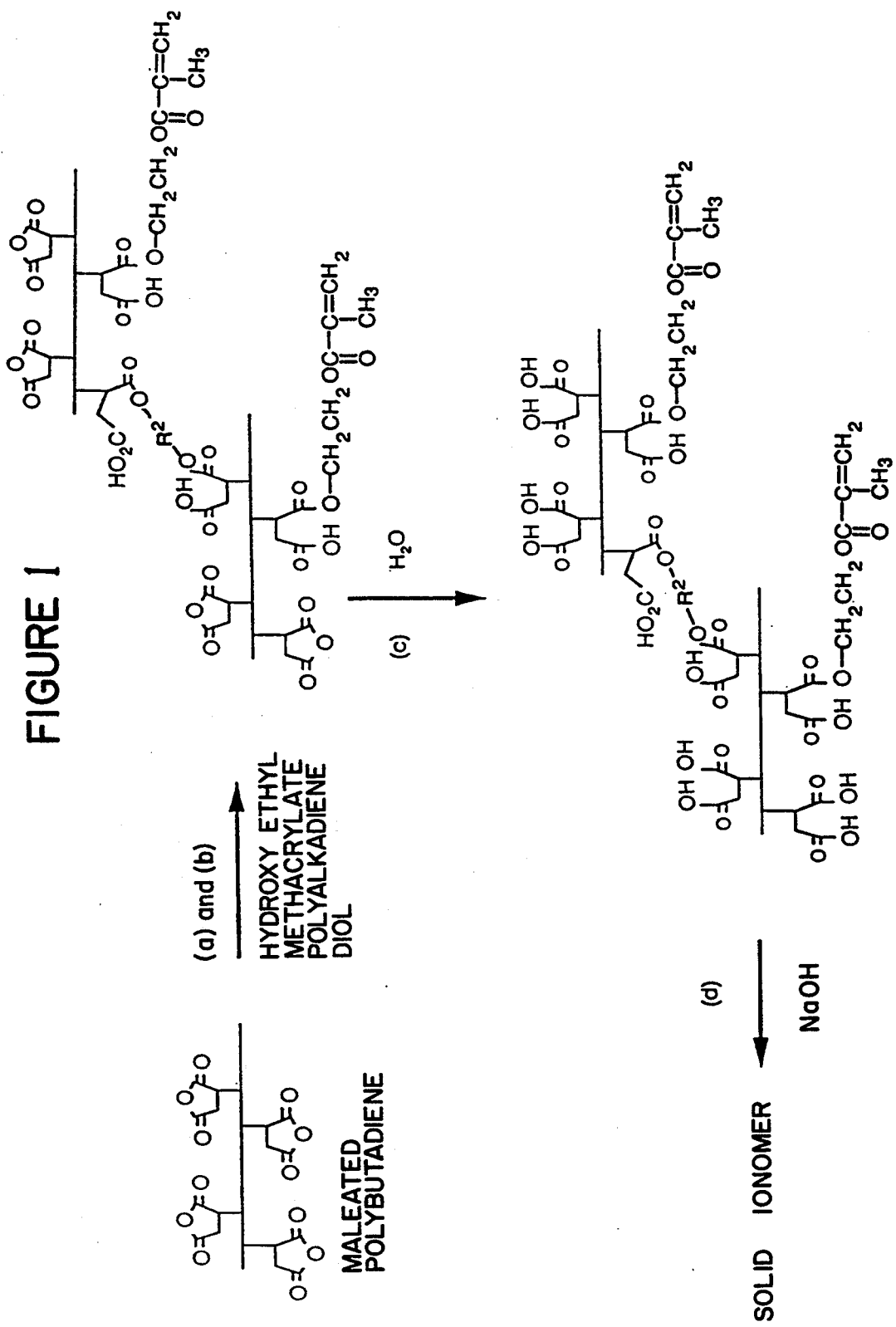

PHOTOCURABLE COMPOSITION COMPRISING MALEIC ANHYDRIDE ADDUCT OF POLYBUTADIENE OR BUTADIENE COPOLYMERS

This application is a continuation-in-part of our application U.S. Ser. No. 514,899, filed Apr. 26, 1990 for "Photocurable Composition Comprising Maleic Anhydride Adduct of Polybutadiene or Butadiene Copolymers" (now abandoned), incorporated herein by reference in its entirety.

FIELD OF THE INVENTION

This invention relates to radiation curable prepolymers and formulations or compositions containing the same, as well as radiation sensitive articles having solid layers prepared from such prepolymers or formulations. The invention also relates to processes for making and using the prepolymer or composition to form the radiation sensitive articles.

BACKGROUND OF THE INVENTION

Photocurable prepolymers and compositions are well known in the art for forming printing plates and other radiation sensitive articles. In the field of flexographic printing plates, the plates typically comprise a support and a photosensitive layer prepared from the photocurable composition. Additional layers on the plate include slip and release films to protect the photosensitive surface. Prior to processing the plate, the additional layers are removed, and the photosensitive layer is exposed to radiation in an imagewise fashion. The unexposed areas of the layer are then removed in developer baths.

Removal of unexposed layers comprising photocurable compositions such as those disclosed in U.S. Pat. No. 2,760,863 require the use of developer baths comprising environmentally unsafe, organic solvents such as tetrachloroethylene, perchloroethylene, 2-butanone, benzene, toluene, xylene, trichloroethane and solvent mixtures such as tetrachloroethylene/n-butanol. However, due to the toxicity, high volatility and low flash point, their use gives rise to hazardous conditions and creates pollution problems. Thus, recently there has been a strong interest in the field to develop photosensitive layers in non-organic solvent developing solutions, e.g. aqueous or alkaline-aqueous solutions. However, the compositions resulting from recent attempts to achieve aqueous developable plates demonstrate deficiencies in mechanical properties or are unsuitable for use with a wide variety of printing inks, especially alcohol based inks.

For instance, in addition to possessing an aqueous developable photosensitive layer, a flexographic printing plate must have sufficient flexibility to wrap around a printing cylinder, yet be strong enough to withstand the rigors experienced during typical printing processes. Further, the printing plate should possess a low hardness to facilitate ink transfer during printing.

Previous aqueous developable compositions have not possessed all the desirable features such as flexibility, softness and solvent resistance to inks typically used in printing. For example, U.S. Pat. No. 4,023,973 describes a photosensitive composition comprising of a maleic anhydride adduct of a 1,2-polybutadiene. However, because the 1,2 content of this material is very high, i.e. 70% or more, this composition has an undesirably high rubber hardness.

Furthermore, other water-developable photosensitive compositions which contain as the main component a high molecular weight polymer such as polyvinyl alcohol, cellulose, polyethylene oxide, or the like, are insufficient in flexibility and rubber hardness and hence are unsuitable for use in flexographic printing plates.

Finally, it is also important that the photosensitive layer of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See U.S. Pat. No. 4,762,892 to Koch et al. and discussion of low molecular weight polymers disclosed in Japanese Kokoku 57-23693.

One attempt to develop an aqueous developable, flexible printing plate is illustrated in U.S. Pat. No. 4,916,045 (Koch et al., assigned to BASF Aktiengesellschaft). Koch et al.'s '045 patent describes a photosensitive recording element consisting primarily of an ionic polymer. The ionic polymer is prepared by the partial esterification or amidation of succinic acid anhydride side groups on an alkadiene polymer. The resultant polymer is then converted into an ionic polymer by reaction with suitable compounds. With reference to the preferred materials, the reference is directed to oligomers having a polybutadiene backbone, side radicals prepared by (a) maleating the polybutadiene, (b) esterifying the resultant pendant succinic anhydride ring with hydroxyethyl methacrylate (HEMA), and (c) neutralizing the carboxyl groups generated during the esterification with a cation from Groups I to V of the Periodic Table. The preferred cation is zinc.

Two processes are described for the preparation of the partially esterified or amidated polymer. The first process involves the reaction of the succinic acid anhydride side groups with hydroxy or amino derivatives of compounds having an olefinically unsaturated double bond (such as hydroxyethyl methacrylate) to introduce a side radical ("B" in the reference), and, if desired, with compounds containing polar groups to produce a further side radical ("D" in the reference). These two compounds are reacted in one step, not sequentially. The second process for partial esterification involves the hydrolysis of all of the succinic acid anhydride side groups with water and reaction of the acid groups so formed with acid reactive compounds containing unsaturated double bonds to introduce side radical "B" or acid reactive compounds containing polar groups to introduce side radical "D".

However, when prepared from certain monovalent cations, Koch et al.'s ionic polymer does not appear to result in a flexible printing plate having sufficient mechanical properties. For instance, it has been found that when an ionomer prepared according to Koch et al.'s teaching is prepared with sodium, the dimensional stability and flexibility of a printing plate prepared from that ionomer are insufficient for use as a plate in flexographic printing. See Example 8 herein. On the other hand, it has recently been found that monovalent cation, e.g. sodium, based ionomers prepared from other polymers will result in flexographic printing plates having excellent dimensional stability and flexibility. Such plates also demonstrate minimal ink swell in aqueous and solvent based inks. See Example 9.

SUMMARY OF THE INVENTION

Accordingly, it is an object of the invention to prepare a photocurable composition which is suitable as an aqueous developable, photosensitive layer on a flexible photosensitive article such as a flexible printing plate.

It is an object of the invention to prepare a solid, photosensitive layer which is flexible, yet strong and durable.

It is also an object to prepare a solid photosensitive layer which when cured in an imagewise pattern results in a relief pattern layer which easily transfers ink in instances the layer is that of a flexible printing plate.

It is thus a further object of the invention to provide a novel photocurable composition possessing the aforementioned properties, the photocurable composition comprising an ionic prepolymer derived from a chain extended maleic anhydride adduct of a base polymer (preferably a polybutadiene or a butadiene copolymer) wherein a significant degree of the segments of the base polymer has a 1,4 microstructure.

A preferred base polymer maleic anhydride adduct is made from polybutadiene having a molecular weight of about 8000 and having about 8 anhydride groups per molecule. In preparing the maleic anhydride-base polymer, the maleic anhydride groups are converted to succinic anhydride groups. The two terms may be used interchangeably.

It is also an object of the invention to prepare a flexible photosensitive article comprising the novel compositions.

It is yet another object of the invention to provide a novel process for preparing flexible, solid photosensitive layer, the process comprising (a) reacting anhydride groups of a maleic anhydride adduct of base polymer wherein a significant degree of the base polymer's segments have a 1,4 microstructure with a reagent having an olefinically unsaturated group and an anhydride reactive group; where, upon reaction of the reagent with a portion of the adduct's anhydride groups, the anhydride groups are opened and an olefinically unsaturated side chain attached and a carboxylic acid group is formed;

(b) chain-extending the adduct by reacting a polymeric alkadiene polyol with unreacted anhydride groups from (a) to increase the molecular weight ($M_n$) of the thus chain-extended polymer to at least about 2500;

(c) then reacting the remaining unreacted anhydride groups from (a) and (b) with water to form more carboxylic acid groups;

(d) then neutralizing a portion or all of the carboxylic acid groups in (c) with Li—, Na—, or K-containing base; and (e) applying the product in (d) on a support wherein the coated product and support form a flexible photosensitive article. The process can also comprise adding photocurable unsaturated monomers and photoinitiators, e.g., to the product of (d) above.

The product of process step (c) (sometimes herein referred to as "non-ionomer") comprises segments of the structure:

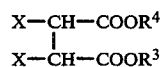

where X and Y are different from one another and are H or a carbon atom of the base polymer;
R is $—(CH_2)_n—OC(:0)C(R^1)=CH_2$;
$R^1$ is H or methyl;
$R^2$ is

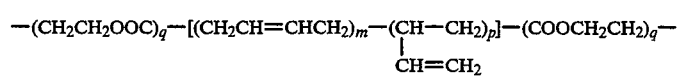

$R^3$ is H;
$R^4$ is R or

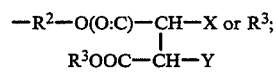

n is 2, 3, or 4;
m+p=15–130; and m is 70–100% of m+p;
q is 0 or 1;
Provided that in at least one segment $R^4$ is R; in at least one segment $R^4$ is

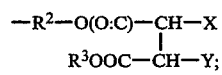

and in at least one segment $R^4$ is $R^3$. For practical and statistical reasons, however, more than one segment will likely have such $R^4$ groups.

The product of process step (d) (herein, "ionomer") comprises segments substantially the same as those in the product of (c), except that $R^3$ is replaced by $R^5$. $R^5$ is $R^3$ or M, where M is Li, Na, or K, provided that in at least one segment $R^5$ is M. For practical and statistical reasons, however, more than one segment will likely have $R^5$ groups wherein $R^5$ is M. Thus, generically speaking, the aforesaid segments may be described as

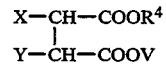

where V is $R^3$ or $R^5$, depending respectively on whether the product is from (c) or (d).

In $R^2$ the segments numbered m and p, although shown for the sake of simplicity in block polymer form, can actually be in random form, or random plus block form.

In a preferred embodiment (cf Example 1) n is 2, $R^1$ is methyl, m is about 70, p is about 23, q is 1, and molecular weight of the base polymer is about 8000.

The results of (a), (b), or (c), and (d) above may include segments that are not chain-extended, so that the final photopolymer of (c) and/or (d) may comprise $R^2$-free segments.

Herein molecular weights are number average, $M_n$ determined by GPC using polystyrene standards.

Referring now to FIG. 1, the principal unit processes in the preferred embodiment of the invention are given in short summary, starting with maleated polybutadiene and concluding with solid ionomer. The species used includes hydroxyethyl methacrylate (HEMA). $R_2$ indicates the central portion of polybutadiene diol. In Steps (a) and (b) maleated polybutadiene is reacted with HEMA and chain-extending polybutadiene diol. The HEMA opens the anhydride group, esterifying one of the carbonyls and converting the other to carboxylic acid, —COOH. During the same reaction, a molecule of the chain-extending diol opens anhydride groups on two or three molecules of maleated polybutadiene and forms —C(:O)O—$R_2$—OC(:O)—linkages, where the carboxyls derive from residual maleic (succinic) anhydride moieties. Two or more chain-extending diols may link any two given maleated base polymer molecules; on the other hand it is expected that some maleated base polymers will escape the chain-extending reaction.

Continuing with FIG. 1, the product of (a) and (b) is reacted with water in (c). This results in hydrolysis of the remaining succinic anhydride groups. The product now comprises copious —COOH groups and little or no anhydride groups. This (c) product is referred to herein as a "non-ionomer" or "pre-ionomer". In (d) the non-ionomer of (c) is treated with NaOH to neutralize some of or all of the —COOH groups and produce the final ionomer product. The product of (d) is ready for formulation with UV-sensitive additives and photoinitiators and solvent casting on a support as explained in detail hereinafter. In FIG. 1, for the sake of simplicity, reaction of the anhydride group with HEMA and/or with the extender is shown with the carbonyl group nearest the base polymer backbone. Actually, the reaction may occur with either anhydride carbonyl, thus (with HEMA):

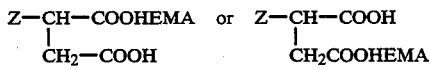

wherein Z is the backbone of the base polymer adduct.

BRIEF DESCRIPTION OF THE DRAWING

FIG. 1 is a simplified flow sheet which illustrates preparing the invention.

DETAILED DESCRIPTION OF THE INVENTION

The photocurable or photosensitive composition (the term "photocurable" and "photosensitive" being used interchangeably throughout) can be a prepolymer derived from a maleic anhydride adduct of polybutadiene having at least about 70 to 80% 1,4 microstructure. As discussed later, the photocurable composition preferably comprises additional photocurable compounds such as unsaturated monomers. "Maleic anhydride" includes substituents as hereinafter discussed.

The term 1,4 microstructure refers to the butadiene segment's structure which results from 1,4 addition to a 1,3 butadiene monomer during polymerization. The general structure for a 1,4 polybutadiene is illustrated below:

$$-[CH_2-CH=CH-CH_2]_m-$$

wherein m is a positive integer depending on the amount of polymerization desired and the molecular weight of the polymer. The remaining percentage of butadiene segments have a 1,2 microstructure which results from 1,2 addition during polymerization. In instances where butadiene segments having 1,2 microstructure are present, the polybutadiene has pendent vinyl groups on its structure, as illustrated below:

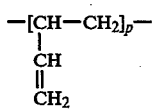

wherein p is a positive integer depending on the amount of polymerization and the molecular weight of the polymer. The formation of the 1,4 microstructure is dependent upon reaction conditions used during the polymerization reaction and can be regulated by known techniques.

For instance, the choice of catalyst or promoter, variation in the polarity of solvents used, variations in the reaction temperatures and the presence of transition metals all influence the 1,4 content of the resulting polymers' microstructure. In general, a polymer having increased 1,4 content will lead to higher elasticity and an increase in the rubbery nature of the composition. It is believed that those properties can be attributed to less crosslinking between pendent vinyl groups which are present on the polybutadienes which have a higher degree of 1,2 microstructure.

The adduct can have a maleic anhydride content of from 5-30 percent by weight of the adduct and preferably contains about 8-20% by weight. Lower amounts of anhydride content decreases the aqueous developability of the photocurable composition, and layers made therefrom, while higher amounts causes the composition and layers therefrom to be hard and less flexible.

The addition of the maleic anhydride to the polybutadiene can be accomplished by reacting the polybutadiene with a maleic anhydride of the general formula

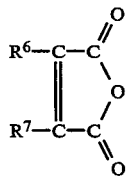

wherein $R^6$ and $R^7$ are individually a member of the group consisting of hydrogen, halogen, carboxyl, linear or cyclic alkyl containing 1-20 carbon atoms, aryl, alkaryl and aralkyl containing 6 to 20 carbon atoms.

For example, the adduct can be formed by heating the polybutadiene and the maleic anhydride to about 220° C., with stirring in a halogenated aromatic hydrocarbon solvent, such as α-chloronapthalene. The reaction can be carried out in the presence of an inhibitor so as to prevent side reactions. Suitable inhibitors include copper, copper salts and copper chelate complexes. The maleic anhydride can be added in any proportion from a minimum of 5% by weight up to 30% by weight, with the percentage of bonded maleic anhydride preferably being between 8 and 20% by weight. The molecular weight of the adduct can be between 1000 and 20,000 number average and is preferably 2,000 to 12,000. Other known techniques of adding maleic anhydride can be used. See U.S. Pat. No. 3,974,129 contents of which are incorporated herein by reference. See also W. Cloak, *Industrial Engineering Chemistry*, Vol. 4, p.2095 (1955).

Commercially available maleic anhydride adducts of 1,4 polybutadiene include a material designated as LX16-10MA from Revertex Ltd. and a material designated as Ricon 131 MA from Colorado Chemical Specialties.

The adduct may also comprise a base polymer which is a butadiene copolymer with styrene, acrylonitrile, chloroprene, isobutylene, propylene, ethylene, or acrylic and methacrylic acids and esters. In instances where a copolymer is used, at least about 70 to about 80% of the butadiene segments should have 1,4 microstructure. Commercially available maleic anhydride adducts of a butadiene copolymer with styrene include Ricon 184 MA from Colorado Chemical Specialties.

The adduct is chain-extended and esterified. These two reactions will be described separately.

(a) Esterification

A portion of the adduct's anhydride groups is esterified with a reagent having an olefinically unsaturated group and a functional group which reacts with and opens the anhydride groups to form carboxylic acid and ester groups. Preferably, the reagent has a structure of

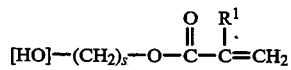

$$[HO]-(CH_2)_s-O-\overset{O}{\underset{\|}{C}}-\overset{R^1}{\underset{|}{C}}=CH_2$$

wherein $R^1$ is hydrogen or methyl and $S=2$ to 4 and [HO] represents the anhydride reactive group. An example of a reagent having hydroxy as the anhydride reactive group is hydroxyethyl methacrylate (HEMA).

The esterification reaction (and chain extension reaction) is carried out at temperatures from 50° C. to 120° C., preferably at about 95°–100° C. for 1 to 6 hours. The reaction is preferably carried out in an organic solvent in which the adduct, vinyl compound, and extension agent are soluble. An organic solvent is needed to facilitate formation of the high molecular weight and high viscosity of the chain extended product. The esterification reagent is added in amounts to react with 5 to 40% of the adduct's anhydride groups. The esterification reaction creates pendent groups having the following structure P:

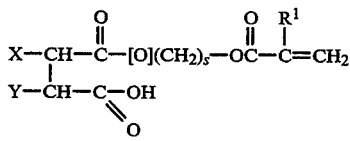

$$X-CH-\overset{O}{\underset{\|}{C}}-[O](CH_2)_s-O\overset{O}{\underset{\|}{C}}-\overset{R^1}{\underset{|}{C}}=CH_2$$
$$Y-CH-\overset{\diagdown}{\underset{O}{C}}-OH$$

wherein [0] is the oxygen linkage formed by the anhydride reactive group and X, Y, , $R^1$, and S are as above defined.

As illustrated above, the pendent groups P provide photocurability to the polybutadiene adduct. When the adduct is exposed to UV radiation, the vinyl groups in P crosslink, thus curing the composition and imparting tensile strength and modulus to any layer prepared from the composition, as well as imparting improved swell resistance of the polymer in solvents. Further, the esterification reaction opens the anhydride groups to form free carboxylic acid groups, thus providing a water dispersible composition which can be developed in aqueous or aqueous-alkaline solutions.

(b) Chain Extension

The adduct is chain extended to improve the physical properties, i.e., increase elongation and provide a stable and durable photosensitive surface. The chain extending agent is a polymeric alkadienyl diol or triol of the structure $[R^2]-[-OH]_2$ or $(R^2)-(-OH)_3$, $R^2$ is as previously defined, and the [—OH] groups are directly attached to the polymeric alkadienyl backbone in the case of $q=0$ or attached to the $(COOCH_2CH_2)$ groups in the case of $q=1$. The chain-extending agent has a molecular weight of about 1000–7000.

In the chain extension reaction carboxyl groups on two base polymer adducts are joined, thus:

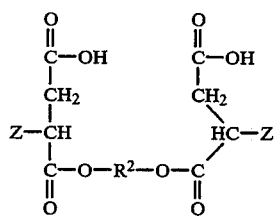

wherein Z is the backbone of the base polymer adduct.

As shown, chain extension of the adducts occurs through a portion of the anhydride groups. Preferably, chain extension occurs through 5 to 30% of the adduct's original anhydride groups.

(c) Hydrolysis

To open the remaining anhydride groups the chain-extended product is reacted with water. This reaction produces additional carboxylic acid groups which when neutralized with monovalent cations as herein described, form a solid photopolymer and increases the water dispersibility of the photocurable composition.

(d) Neutralization

Finally, to provide the ionomer previously illustrated the carboxyl groups are neutralized by bases that provide Li, Na, or K ions, such as (but not limited to) lithium hydroxide, sodium hydroxide, or potassium hydroxide. The neutralized carboxylic acid groups on the ionomer are represented by —COOV wherein V is $R_5$ and $R_5$ is M, i.e. Li, Na or K. It has been found that the resulting salts have improved physical properties such as higher resilience, higher elongation and better resistance to swell in organic solvents commonly used in printing inks.

The selection of one of the three stated cations permits synthesis of a photopolymer tailor-made for a specific end use. For example, Li gives lower swells in aqueous based printing inks, while Na gives lower swells in solvent based inks.

Proportions

The relative proportions of ingredients in forming the photopolymer are important. For example, too much HEMA results in a product too hard to permit good ink transfer. Too little chain extension results in a product with low elongation, and too little hydrolysis of the remaining anhydride groups will yield a material which will not become a solid when neutralized with monovalent cations.

Based on 100 parts by weight of maleic anhydride adduct of base polymer (polyalkadiene homo- or copolymer), of which 5–30, preferably 8–20 parts by weight is maleic anhydride moiety, we use (in parts by weight except as noted):

Olefinically unsaturated side chain additive (e.g., HEMA), about 0.7–3.2, preferably about 2.0–2.6;

Polyalkadienyl polyol chain extender (e.g., polybutadiene diol), about 10–63, preferably about 30–50;

Water, sufficient to complete hydrolysis of substantially all remaining anhydride groups still present after steps (a) and (b), and suitably in slight excess;

Li—, Na—, or K-containing base, sufficient to neutralize about 40–100 % of the carboxylic acid groups, preferably about 50–70 % in the non-ionomer with formation of ionomer.

physical Properties

To succeed commercially a flexographic printing plate should meet certain physical requirements, typically:

(1) Elongation (ASTM D 412) should exceed about 140.

(2) Tensile strength (ASTM D 412) should exceed about 300.

(3) Tensile modulus (1% elongation) (ASTM D 412) should not exceed about 2000.

(4) Shore hardness (ASTM 2240) should not exceed about 60.

Printing plates prepared from prepolymers in accordance with the processes of the instant invention readily meet these criteria.

As mentioned earlier, the photocurable compositions can also contain components in addition to the above described neutralized prepolymer. For instance, photocurable monomer diluents are preferably added. Operable diluents include reactive acrylic or methacrylic diluents of the formula

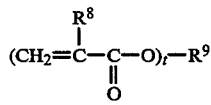

wherein $R^8$ is hydrogen or methyl, and $R^9$ is an organic moiety having the valence of t, and t is 1 or more. Such reactive acrylic diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-methylolpropane tetraacrylate, triacrylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, polybutadiene diacrylate and the like which can be added to the composition. Monoacrylates such as cyclohexyl acrylate, isobornyl acrylate, lauryl acrylate, dicyclopentenyloxyethyl acrylate and tetrahydrofurfuryl acrylate and the corresponding methacrylates are also operable as reactive diluents.

Other suitable diluents include polymerizable ethylenically unsaturated addition monomers described in U.S. Pat. No. 4,442,302, contents of which are incorporated herein by reference. Those monomers include monofunctional, difunctional or polyfunctional compounds based on moieties such as (meth)acrylonitriles and acrylamides, as well as the (meth)acrylics described above.

Suitable photoinitiators for the photocurable composition include benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e., Irgacure® 651 (Ciba-Geigy); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthene-quinone, valerophenone, hexanophenone, alpha-phenyl-butyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators. The photoinitiators or mixtures thereof are usually added in an amount ranging from 0.01 to 5% by weight of the total weight of the photocurable composition.

Other additives to the photocurable composition can be included. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. Such additives are used in an amount within the range of from about 0.01 to about 2% by weight of the prepolymer. These stabilizers are effective in preventing crosslinking of the prepolymer composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

The photocurable composition can then be shaped and formed as a solid layer of suitable thickness according to conventional solvent casting, i.e., dissolving the composition in a solvent, shaping the solution into a film or plate and removing the solvent. Conventional extrusion calendaring or hot press techniques can also be used. Solid layers of the photosensitive composition in the form of a film can be adhered to supports such as those comprising polyester, nylon or polycarbonate. Other suitable supports include woven fabrics and mats, e.g. glass fiber fabrics, or laminated materials made of, for example, glass fibers and plastics. It is preferred that the supports are dimensionally stable and resistant to the washout solutions.

It is necessary to protect photosensitive surfaces from contamination by dirt and dust during storage before being exposed and washed. Such protection is accomplished by lamination or application of a flexible protective cover sheet to the side of the photocurable composition opposite that of the support. As mentioned before the photocurable compositions can sometimes be tacky and it is desirable to apply a release film to the surface of the photosensitive layer before application of the coversheet. This release film may consist of a thin, flexible and aqueous dispersible polymeric film. This film allows for intimate contact between the surface of the photocurable composition opposite to the support and an image bearing negative applied to the surface.

Photosensitive articles comprising a support having a solid layer or surface comprising the photocurable composition, e.g. solid flexographic printing plates, can then be processed by well known techniques for imagewise exposure to actinic light. Preferably, the light should have a wavelength of from about 230–450 mm. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 2 to 20 minutes are preferred.

After exposure and the negative has been removed, the unexposed areas of the photosensitive surface can be developed in aqueous solutions. Suitable solutions include those of nonionic and cationic surfactants, as well as basic and semi-aqueous basic solutions and combinations thereof. Such surfactants are commercially available as Triton ® X-100 from Union Carbide Company and Igepal ® CO-730 from GAF Corporation.

The following are examples illustrating the instant invention and are not intended to restrict the scope of the invention in any manner.

EXAMPLE 1

Preparation of Non-Ionomer Prepolymer 409 g of a maleated polybutadiene ($M_n$=8800, degree of maleation=9%), 165 g of hydroxy terminated polybutadiene (hydroxyl number=22.65), 9.1 g of hydroxyethyl methacrylate, 2.3 g of butylated hydroxy toluene antioxidant (BHT) and 726 g of toluene were charged into a 3 L resin kettle equipped with an overhead stirrer, condenser and thermocouple. This mixture was heated at 95°–100° C. with stirring for 4 hours at which time the reaction was complete as determined by IR spectroscopy. The solution was cooled to 60° C., and an excess of water added (8 g) and then stirred for an additional 16 hours. Analysis by IR spectroscopy showed the complete disappearance of the anhydride adsorption band at 1780 $cm^{-1}$ indicating the reaction was over.

EXAMPLE 2

Preparation of 60% Sodium Ionomer

To 41 g of the prepolymer prepared in Example 1 (92 g of solution) was added 1 g NaOH dissolved in 12 g methanol. This mixture was stirred at room temperature for 1 hour. 4.11 g of hexanediol dimethacrylate, 2.75 g of dicyclopentenyloxyethyl methacrylate and 0.484 g Irgacure 651 were then added and mixed for an additional hour.

EXAMPLE 3

Preparation of 60% Lithium Ionomer

To 41 g of a prepolymer prepared as in Example 1 was added 0.95 g lithium methoxide dissolved in 18 g methanol. After stirring for one hour, 4.11 g hexanediol dimethacrylate, 2.75 g dicyclopentenyloxyethyl methacrylate and 0.484 g Irgacure 651 was added and mixed until well blended.

EXAMPLE 4

Preparation of 60% Potassium Ionomer

To 41 g of a prepolymer prepared as in Example 1 was added 1.62 g of 85% potassium hydroxide in 12 g methanol. After stirring for one hour, 4.11 g hexanediol dimethacrylate, 2.75 g dicyclopentenyloxyethyl methacrylate and 0.484 g Irgacure 651 was added and the solution mixed for an additional hour.

EXAMPLES 5 to 7

(Effect of cation on physical properties and swell in aqueous and solvent inks.)

The formulated products of Examples 2 to 4 were solvent cast to produce solid, dry films. The films were cured by exposure to UV light and their mechanical properties and swell resistance in typical flexographic inks determined.

|  | Modulus psi | Elong. % | Tensile Strength psi | Resilience % | Shore A | 24 Hour Weight Gain | |
|---|---|---|---|---|---|---|---|
|  |  |  |  |  |  | Solvent Ink | Aqueous Ink |
| Example 5 (Na) | 553 | 180 | 362 | 48 | 60 | 6.0% | 7.4% |
| Example 6 (Li) | 573 | 197 | 375 | 46 | 57 | 9.4% | 5.9% |
| Example 7 (K) | 393 | 140 | 325 | 51 | 60 | 8.3% | 17.0% |

The following Example shows the effect of high HEMA content on physical properties as well as the effect of no hydrolysis on the solidness of monovalent cation salts.

EXAMPLE 8

Preparation of 60% Sodium Ionomer (Not the Invention)

182 g of a maleated polybutadiene ($M_n$=8800, degree of maleation=9%), 20 g hydroxyethyl methacrylate, 1.0 g BHT and 160 g toluene were charged into a 2 l resin kettle equipped with an overhead mechanical stirrer, condenser and thermocouple. The mixture was heated at 90° C. with stirring until IR analysis indicated the reaction was complete (disappearance of the anhydride adsorption band at 1780 cm$^{-1}$).

To 24.4 g of prepolymer (50 g of solution) was added 0.46 g NaOH dissolved in 6 g methanol. After stirring for 1 hour, 2.4 g hexane diol dimethacrylate, 1.6 g dicyclopentenyloxyethyl methacrylate and 0.3 g Irgacure 651 was added to the ionomer solution and mixed thoroughly. This mixture was solvent cast to produce a 20 mil film. The tacky, non-solid film obtained was unsuitable for use as a solid printing plate due to dimensional instability. The mechanical properties of a film cured by exposure to UV light are shown below.

| Tensile Modulus | Elongation | Tensile Strength | Shore A Hardness |
|---|---|---|---|
| 3850 psi | 50% | 850 psi | 80 |

EXAMPLE 9

A Preferred Embodiment

A formulated sodium ionomer solution prepared as described in Example 2 was solvent cast onto a polyester support to provide a solid, nontacky 67 mil thick film. This film was imaged by UV exposure through a negative and developed in a 4% Triton RW-150 surfactant solution at 140° F. A printing plate with 30 mils relief and excellent reproduction of the negative film image was obtained. This plate was found to have excellent ink transfer with both aqueous and solvent-based inks.

A conventional photopolymer backing is a polyester film (e.g., "Mylar") coated with a urethane adhesive. The ionomer forms of the photopolymers of this invention do not adhere well to this particular type of backing. We have found, however, that we can coat such backing with a thin coating of our photopolymer in its non-ionomer form in solvent (result of step (c)), and that, so primed, the photopolymer in ionomer form (result of step (d)) (and preferably promptly applied) will then adhere firmly to the plate. Both coatings can be applied by conventional solvent casting onto a belt, with application of several layers. Evaporation of solvent is completed by conventional oven drying.

What is claimed:

1. A prepolymer comprising segments of the structure:

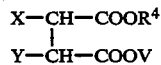

where X and Y are different from one another and are H or a carbon atom of the base polymer; the base polymer being polybutadiene or a butadiene copolymer;

V is H, Li, Na or K
R is —(CH$_2$)$_n$—OC(:O)C(R$^1$)=CH$_2$;
R$^1$ is H or methyl;
R$^2$ is

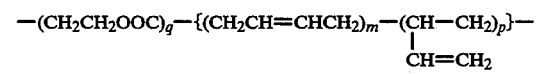

-continued

R$^4$ is H or R or

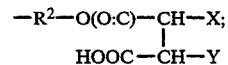

n is 2, 3, or 4;
m+p =15–130; and m is 70–100% of m+p;
q is 0 or 1;
provided that in at least one segment R$^4$ is R; in at least one segment R$^4$ is

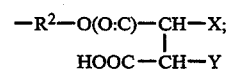

in at least one segment R$^4$ is H; and in at least one segment V is Li, Na, or K.

2. Prepolymer according to claim 1 wherein V is H.

3. Prepolymer according to claim 1 wherein V is about 0–60% H and about 40–100% of a metal ion selected from the group consisting of Li, Na, K or mixtures thereof.

4. A prepolymer according to claim 3 wherein n is 2; R$^1$ is methyl; m is about 70, p is about 23, q is 1, and the molecular weight of the base polymer is about 8000.

5. A prepolymer according to claim 1 wherein the segments are derived from a polybutadiene maleic anhydride adduct wherein said maleic anhydride adduct is a polybutadiene having a molecular weight of about 8000 and having about 8 anhydride groups per molecule.

6. A prepolymer according to claim 4 wherein said maleic anhydride adduct has been prepared with an anhydride of the formula

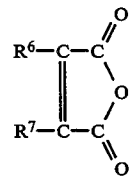

wherein R$^6$ and R$^7$ are individually a member of the group consisting of hydrogen, halogen, carboxyl, linear or cyclic alkyl containing 1–20 carbon atoms, aryl, alkaryl and aralkyl containing 6 to 20 carbon atoms.

7. A prepolymer according to claim 1 wherein said base polymer is a polybutadiene comprising at least about 70% 1,4 microstructure.

8. A prepolymer according to claim 1 with an average molecular weight of about 15,000 and wherein the base polymer is a polybutadiene.

9. A prepolymer according to claim 1 wherein n=2 and R$^1$ is methyl.

10. A prepolymer according to claim 1 comprising a maleic anhydride adduct of a polybutadiene having a molecular weight of about 8000, 8 anhydride groups per molecule and comprising about 70% 1,4 microstructure; and wherein said maleic anhydride adduct has been chain extended to an average molecular weight of about 15,000 and wherein n=2 and R$^1$ is methyl.

* * * * *